(12) United States Patent
Likhanskii et al.

(10) Patent No.: US 9,685,298 B1
(45) Date of Patent: Jun. 20, 2017

(54) APPARATUS AND METHOD FOR CONTAMINATION CONTROL IN ION BEAM APPARATUS

(71) Applicant: Varian Semiconductor Equipment Associates, Inc., Gloucester, MA (US)

(72) Inventors: Alexandre Likhanskii, Malden, MA (US); Jay T. Scheuer, Rowley, MA (US); William Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/012,308

(22) Filed: Feb. 1, 2016

(51) Int. Cl.
*H01J 37/08* (2006.01)
(52) U.S. Cl.
CPC ..................... *H01J 37/08* (2013.01)
(58) Field of Classification Search
CPC ........................................ H01J 37/08
USPC ................. 250/423 R, 424, 492.1–492.3
See application file for complete search history.

(56) References Cited

U.S. PATENT DOCUMENTS

| | | | | |
|---|---|---|---|---|
| 3,585,397 A * | 6/1971 | Brewer | ................. | G21K 1/087 250/298 |
| 2007/0137671 A1 | 6/2007 | DiVergilio et al. | | |
| 2009/0189096 A1 * | 7/2009 | Chen | ................. | H01J 37/08 250/492.21 |
| 2010/0327180 A1 | 12/2010 | Schwind et al. | | |
| 2014/0261173 A1 | 9/2014 | Lane | | |
| 2015/0228446 A1 | 8/2015 | Breymesser et al. | | |

FOREIGN PATENT DOCUMENTS

WO    WO2015134108 A1    9/2015

OTHER PUBLICATIONS

Kevin Anglin, et al., In-Situ Plasma Cleaning of Process Chamber Components, U.S. Appl. No. 14/820,747, filed Aug. 7, 2015.
International Search Report and Written Opinion mailed Apr. 6, 2017 for PCT Application PCT/US2017/012433 filed Jan. 6, 2017.

\* cited by examiner

*Primary Examiner* — Michael Maskell (57) ABSTRACT

An apparatus may include an ion source generating an ion beam, the ion source coupled to a first voltage. The apparatus may further include a stopping element disposed between the ion source and a substrate position; a stopping voltage supply coupled to the stopping element; and a control component to direct the stopping voltage supply to apply a stopping voltage to the stopping element, the stopping voltage being equal to or more positive than the first voltage when the ion beam comprises positive ions, and being equal to or more negative than the first voltage when the ion beam comprises negative ions, wherein at least a portion of the ion beam is deflected backwardly from an initial trajectory as deflected ions when the stopping voltage is applied to the stopping element.

20 Claims, 10 Drawing Sheets

APPARATUS AND METHOD FOR CONTAMINATION CONTROL IN ION BEAM APPARATUS

FIELD OF THE DISCLOSURE

The disclosure relates generally to techniques for manufacturing electronic devices, and more particularly, to techniques for reducing contamination in ion implantation apparatus.

BACKGROUND OF THE DISCLOSURE

Ion implantation is a process for introducing dopants, additives, or impurities into a substrate via bombardment. Known ion implantation systems or apparatus may comprise an ion source and a series of beam-line components. The ion source may comprise a chamber where desired ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having desired species, shape, energy, and other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat. Other ion implantation apparatus including compact ion implantation arrangements where a substrate may be located within a plasma chamber or in a process chamber adjacent to a plasma chamber.

In beamline ion implanters, the ion implanter system generates a stable, well-defined ion beam for a variety of different ion species and extraction voltages to desirably operate the ion source for extended periods of time, while avoiding the need for maintenance or repair. After several hours of normal operation using source gases (such as $AsH_3$, $PH_3$, $BF_3$, and other species), beam constituents may eventually create deposits on beam optics. Beam optics within a line-of-sight of a wafer to be implanted may also become coated with residues from the wafer, including Si and photoresist compounds. These residues build up on the beam-line components, causing spikes in the DC potentials during normal operation (e.g., in the case of electrically biased components) and eventually flake off, causing an increased likelihood of particulate contamination on the wafer.

To mitigate possible flaking issues, components having buildup may be removed for cleaning periodically, requiring significant down time. Repurposing an ion beam line used for implantation to periodically etch beamline components to reduce flaking may in principle help avoid flaking. A drawback of this latter approach is the presence of shadowed surfaces of components not in the direct line of sight of the ion beam, including surfaces facing a wafer, may not be etched by the ion beam, allowing buildup and flaking to occur on the shadowed surfaces.

SUMMARY

In one embodiment, an apparatus may include an ion source generating an ion beam, the ion source coupled to a first voltage. The apparatus may further include a stopping element disposed between the ion source and a substrate position; a stopping voltage supply coupled to the stopping element; and a control component to direct the stopping voltage supply to apply a stopping voltage to the stopping element, the stopping voltage being equal to or more positive than the first voltage when the ion beam comprises positive ions, and being equal to or more negative than the first voltage when the ion beam comprises negative ions, wherein at least a portion of the ion beam is deflected backwardly from an initial trajectory as deflected ions when the stopping voltage is applied to the stopping element.

In another embodiment, a system may include an ion source generating an ion beam, the ion source coupled to a first voltage; a substrate stage disposed downstream of the ion source, the substrate stage to house a substrate; at least one beamline component to direct the ion beam as a primary ion beam toward the substrate stage; a stopping element disposed downstream of the ion source; a stopping voltage supply coupled to the stopping element; and a control component to direct the stopping voltage supply to apply a stopping voltage to the stopping element, the stopping voltage being equal to or more positive than the first voltage when the ion beam comprises positive ions, and being equal to or more negative than the first voltage when the ion beam comprises negative ions, wherein at least a portion of the primary ion beam is deflected backwardly as deflected ions away from the substrate when the stopping voltage is applied to the stopping element.

A method may include generating ions in an ion source; applying a first voltage to the ion source; extracting the ions from the ion source and directing the ions as a primary beam toward a substrate position; and during a cleaning period applying a stopping voltage to a stopping element, the stopping element being disposed between the ion source and substrate position, wherein the stopping voltage is equal to or more positive than the first voltage when the ion beam comprises positive ions, and being equal to or more negative than the first voltage when the ion beam comprises negative ions, and wherein at least a portion of the primary ion beam is deflected backwardly from an initial trajectory as deflected ions.

The drawings are not necessarily to scale. The drawings are merely representations, not intended to portray specific parameters of the disclosure. The drawings are intended to depict typical embodiments of the disclosure, and therefore are not to be considered as limiting in scope. In the drawings, like numbering represents like elements.

DETAILED DESCRIPTION

A system, apparatus and method in accordance with the present disclosure will now be described more fully hereinafter with reference to the accompanying drawings, where embodiments of the system, apparatus and method are shown. The system, apparatus and method may be embodied in many different forms and are not to be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

In various embodiments, systems, apparatus, and methods are provided for controlling the trajectory of an ion beam in a novel manner to facilitate cleaning of components in an ion beam apparatus.

Figure 1A:
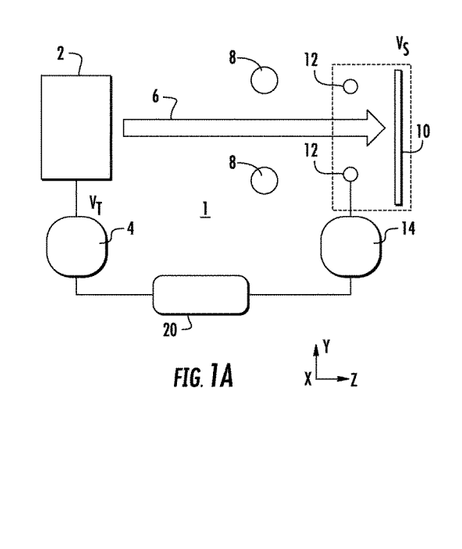
FIG. 1A and FIG. 1B present a block diagram of an apparatus according to embodiments of the disclosure.
Figure 1B:
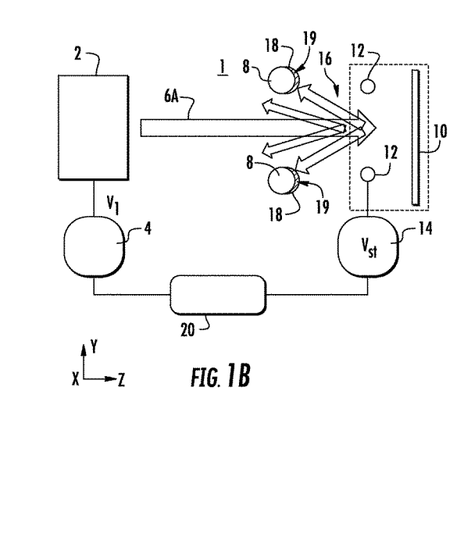

FIG. 1A and FIG. 1B present a block diagram of an apparatus 1 according to embodiments of the disclosure. The apparatus 1 may be termed an "ion beam apparatus," and may generally represent a beamline ion implanter or a compact apparatus generating an ion beam. Accordingly, various known components of ion beam apparatus may be omitted for clarity. As illustrated, the apparatus 1 includes an ion beam source, shown as ion source 2. The ion source 2 may also comprise a power source and an extraction electrode assembly (not shown) disposed near a chamber of the ion source 2.

The ion source 2 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 2 may generate an ion beam 6 for processing a substrate 10. In various embodiments the ion beam (in cross-section) may have a targeted shape, such as a spot beam or ribbon beam, as known in the art. In the Cartesian coordinate system shown, the direction of propagation of an ion beam may be represented as parallel to the Z-axis, while the actual trajectories of ions with the ion beam 6 may vary. In order to process the substrate 10, the ion beam 6 may be accelerated to acquire a target energy by establishing a voltage (potential) difference between the ion source 2 and substrate 10. As shown in FIG. 1A, the ion source 2 may be coupled to a targeted voltage, shown as $V_T$, where $V_T$ is supplied by a voltage supply 4, and is designed to generate a targeted ion energy for ions during processing of the substrate 10. In particular, the ion energy of ions in the ion beam 6 when impacting the substrate 10 may be determined by the difference between $V_T$ and $V_S$, the substrate potential. Examples of ion energy for processing a substrate may range from several hundred eV to hundreds of thousands of eV. The embodiments are not limited in this context.

In a processing mode of operation, the apparatus 1 may be employed to process the substrate 10 by establishing a plasma in ion source 2, applying the voltage $V_T$ to ion source 2, and extracting the ion beam 6 while the substrate is maintained at the substrate potential $V_S$. This causes the ion beam 6 to be accelerated to the substrate 10 as shown in FIG. 1A. In examples where the ion beam 6 is used for implantation doping or depositing a material, during a processing mode the ion beam 6 may include species tending to condense on various surfaces within the ion beam apparatus 1. These may include surfaces that are not impacted by the ion beam 6, resulting in accumulation on those surfaces. For example, components 8, representing any component in the apparatus 1, may be subject to accumulation of dopant material during a processing mode, especially surfaces not directly exposed to the ion beam 6.

Turning now to FIG. 1B the apparatus 1 is shown in a cleaning mode of operation. In this example, a first voltage, shown as V1, is coupled to the ion source 2, where V1 is generated by the voltage supply 4 when connected to the ion source 2. Accordingly, using known extraction components (not shown), an ion beam 6A may be extracted from the ion source 2 and accelerated toward the substrate 10 along an initial trajectory, in this case, parallel to the Z-axis and pointing toward the right in the figure. As detailed in the embodiments to follow, the selection of the magnitude and sign of the voltage V1 may be adjusted to tailor the cleaning of components within an ion beam apparatus. In some examples, the ion beam 6A may differ in composition from the ion beam 6. For example, while ion beam 6 may include dopant species, the ion beam 6A may include inert gas ions (Ar, He, Ne, Kr, and so forth). In other embodiments, ion beam 6A may include reactive ions useful for cleaning deposits from a surface, such as fluorine, fluorine compounds including $NF_3$, chlorine, chlorine compounds, oxygen, or the like. In addition, as shown, the apparatus 1 includes a stopping element 12 and a stopping voltage supply 14 coupled to the stopping element 12. The apparatus 1 may further include a control component 20 to direct the stopping voltage supply 14 to apply a stopping voltage, shown as $V_{ST}$, to the stopping element 12. The control component 20 may be embodied in logic as well as memory, and may include any combination of hardware and software to adjust voltages supplied by the stopping voltage supply 14 as well as the voltage supply 4. The control component 20 may include, for example, semiconductor circuitry including a controller, and computer-readable storage medium including instructions when executed cause various components of an ion beam apparatus to operate as disclosed herein. In this manner, the voltages established at the ion source 2 and stopping element 12 may be altered to switch from a cleaning mode of operation to a processing mode of operation.

In accordance with embodiments of the disclosure, the stopping voltage may be equal to or more positive than the first voltage, V1. The terms "more positive" or "less positive" as used herein with respect to voltages (potentials) may refer to a relative voltage of two different entities. Accordingly, 0V is "more positive" than −5 kV, while +10 kV is more positive than 0V, for example. Moreover, −10 kV is "less positive" than −5 kV. The terms "less negative" negative or "more negative" may also refer to a relative voltage. For example, 0 kV may be referred to as more negative than +5 kV, while +10 kV is less negative than +5 kV.

In circumstances where the stopping voltage is equal to or more positive than the first voltage, V1, at least a portion of the ion beam 6A may be deflected backwardly from the initial trajectory as deflected ions 16, when the stopping voltage is applied to the stopping element 12. The portion of backwardly deflected ions of ion beam 6A are shown as ions 16. Advantageously, the trajectories of the ions 16 may allow the ions 16 to impact surfaces not exposed to the ion beam 6A, or ion beam 6. These surfaces are illustrated for clarity as a shadowed surface region 19 in FIG. 2B. As discussed above, such regions may tend to accumulate material during a processing mode of operation, shown as deposit 18 in FIG. 1B. By generating the ions 16 with appropriate trajectories, the deposit 18 may be removed after exposure to sufficient dose of ions 16, obviating the need to remove components 8 from the apparatus 1 for external cleaning.

Figure 2:
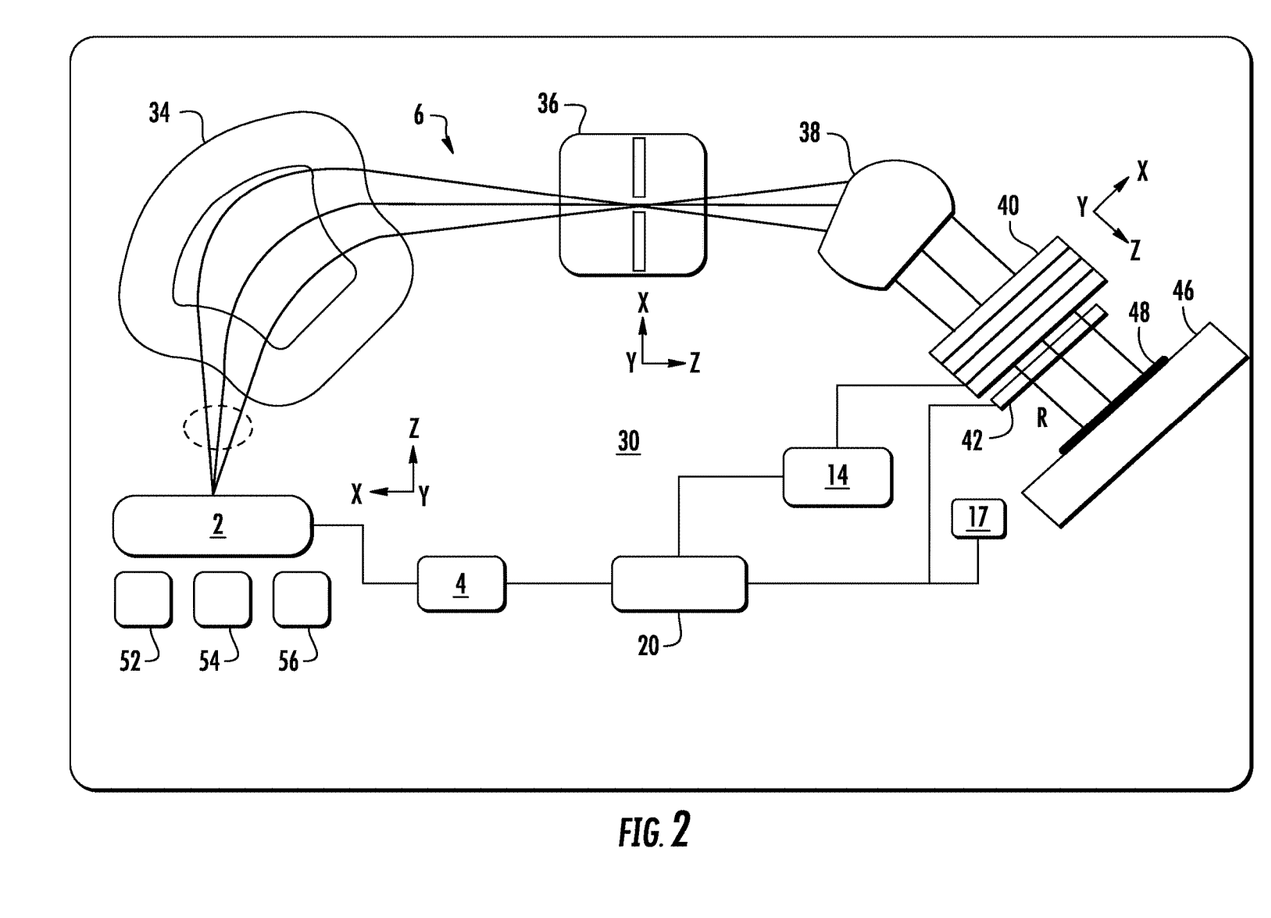
FIG. 2 shows an exemplary embodiment of a system in accordance with the present disclosure.

Referring now to FIG. 2, an exemplary embodiment demonstrating a system 30 in accordance with the present disclosure is shown. The system 30 may be configured as a beamline ion implantation system containing, among other components, an ion source 2 for producing an ion beam 6, and a series of beam-line components. The ion source 2 may comprise a chamber for receiving a flow of gas 24 and generating ions. The ion source 2 may also comprise a power source and an extraction electrode assembly disposed near the chamber (not shown). The beam-line components may include, for example, a mass analyzer 34, a first acceleration or deceleration stage 36, a collimator 38, an electrostatic filter (EF) 40 for accelerating or decelerating the ion beam 6, and a plasma flood source 42 for neutralizing the ion beam 6. A gas source 17, in some embodiments a reactive gas source, may provide gas to the plasma flood source 42. Additionally, the control component 20 may include logic to send a signal to generate a plasma in the plasma flood source 42 when a stopping voltage is applied to the stopping element 12.

In exemplary embodiments, the beam-line components may filter, focus, and manipulate the ion beam 6 to have a desired species, shape, trajectory, energy, and other qualities. The ion beam 6 may be directed by at least one beamline component toward a substrate chamber, or substrate stage, and in the particular example of FIG. 2, to a substrate 48 mounted on a platen or clamp, shown as the substrate stage 46. The substrate 48 may be moved in one or more dimensions (e.g., translate, rotate, and tilt).

As shown, there may be one or more feed sources, shown as source 52, source 54, and source 56, coupled with the chamber of the ion source 2. In some embodiments, material provided from a feed source may include source material for implantation, deposition, or cleaning. The source material may contain dopant species introduced into the substrate in the form of ions. The cleaning material may also include a cleaning agent (e.g., an etchant gas, or reactive gas) introduced into the chamber of the ion source 2 and forming part of the ion beam 6 to clean one or more of the beam-line components.

As described above, the voltage supply 14 may be employed in a cleaning mode to apply a voltage to a stopping component (not shown) to redirect at least a portion of the ion beam 6, resulting in in-situ cleaning of select beamline components. For example, when located in the position R, a stopping component may be effective to clean shadowed surfaces of components located upstream of position R, such as plasma flood source 42 or electrostatic filter 40.

In various embodiments, a stopping element may comprise an electrode configured as a first pair of rods disposed in an electrostatic filter, where the rods are electrically conductive. The electrostatic filter may include at least one additional electrode comprising a second pair of rods and disposed upstream of the stopping element. The at least one additional electrode may include a shadowed surface region not exposed to a primary beam. As described below, by proper operation of the stopping element, the shadowed surface region in at least one additional electrode may intercept the deflected ions generated by the stopping element.

Figure 3:
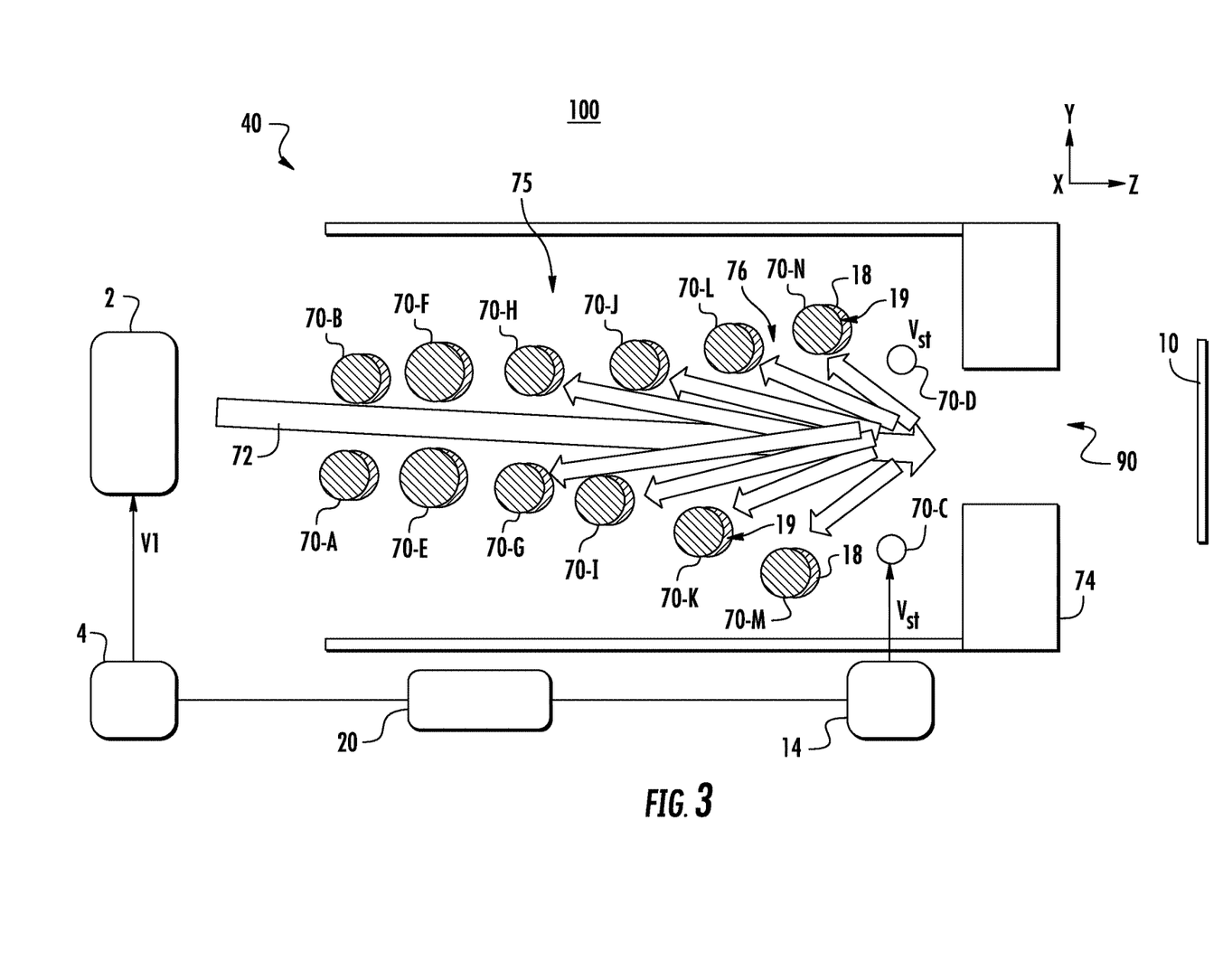
FIG. 3 shows a side view of an apparatus according to further embodiments of the disclosure.

Referring now to FIG. 3, there is shown a side view of an apparatus 100 according to further embodiments. The apparatus 100 may include an electrostatic filter 40 of the system 30 shown in FIG. 2, as will be described in greater detail. In various embodiments, the electrostatic filter 40 and similar embodiments of electrostatic filters disclosed below may extend several tens of centimeters along the Z-axis and X-axis, as well as along the Y-axis. The embodiments are not limited in this context. In exemplary embodiments, the electrostatic filter 40 is a beam-line component configured to independently control deflection, deceleration, and focus of the ion beam 72. As will be described in greater detail below, the electrostatic filter 40 may include a configuration of electrostatic elements (e.g., ion beam optics) comprising a set of upper electrodes disposed above the ion beam 72 and a set of lower electrodes disposed below the ion beam 72. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at each point along the central ion beam trajectory for independently controlling deflection, deceleration, and/or focus of an ion beam.

As shown, the electrostatic filter 40 includes a plurality of conductive electrostatic elements (electrodes), shown as electrostatic elements 70-A to 70-N corresponding to a plurality of beam-line electrodes (e.g., graphite electrode rods). In one embodiment, the electrostatic elements 70-A to 70-N are conductive beam optics disposed along an ion beam-line, as shown. In this embodiment, the electrostatic elements 70-A to 70-N are arranged in a symmetrical configuration, wherein the electrostatic elements 70-A and 70-B represent a set of entrance electrodes, the electrostatic elements 70-C and 70-D represent a set of exit electrodes, and the remaining electrostatic elements 70-E to 70-N represent several sets of suppression/focusing electrodes. As shown, each set of electrode pairs provides a space/gap to allow the ion beam 72 (e.g., a ribbon beam) to pass therethrough. In exemplary embodiments, the electrostatic elements 70-A to 70-N are provided in a chamber 74.

In one embodiment, the electrostatic elements 70-A to 70-N include pairs of conductive pieces electrically coupled to each other. Alternatively, the electrostatic elements 70-A to 70-N may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the electrostatic elements 70-A to 70-N are depicted as seven (7) pairs (e.g., with five (5) sets of suppression/focusing electrodes), any number of elements (or electrodes) may be utilized in various embodiments. For example, the configuration of electrostatic elements 70-A to 70-N may utilize a range of three (3) to ten (10) electrode sets.

In some embodiments, in a processing mode, the ion beam 72 passing through the electrostatic elements 70-A to 70-N along the ion beam-line may include boron or other elements for implantation into substrate 10, or for condensation on substrate 10. This may result in formation of the deposits 18, as shown and discussed above with respect to FIG. 1B. In a cleaning mode, generally shown in FIG. 3, the ion beam 72 may comprise reactive ions or inert gas ions or a combination of the two in some embodiments. During a cleaning mode, a stopping voltage may be applied to a stopping element, redirecting the ion beam 72 as shown. In particular, at least a portion of the ion beam 72 may be directed backwardly away from the initial trajectory (pointing along the Z-axis to the right). This result is shown in the ions 76, where the ions 76 have trajectories intercepted by various elements of the electrostatic elements 70-A to 70-N, and in particular in the shadowed surface regions 19. In this manner, the electrostatic elements 70-A to 70-N may be cleaned without removal from the electrostatic filter 40. In the particular embodiment of FIG. 3, the electrostatic element 70-C and electrostatic element 70-D may constitute a stopping element as described above. The electrostatic element 70-C and electrostatic element 70-D may be electrically connected to one another and may be coupled to the stopping voltage supply 14 to receive a stopping voltage, $V_{ST}$, where the stopping voltage is equal to or more positive than the first voltage, V1. This may result in decelerating ions in the ion beam 72, and reversing their trajectories as shown. While the embodiment of FIG. 3 illustrates the use of exit electrodes of an energy filter as a stopping element during cleaning mode, in other embodiments a dedicated stopping element may be included, where the dedicated stopping element is not generally used to adjust an ion beam during a processing mode.

Figure 4A:
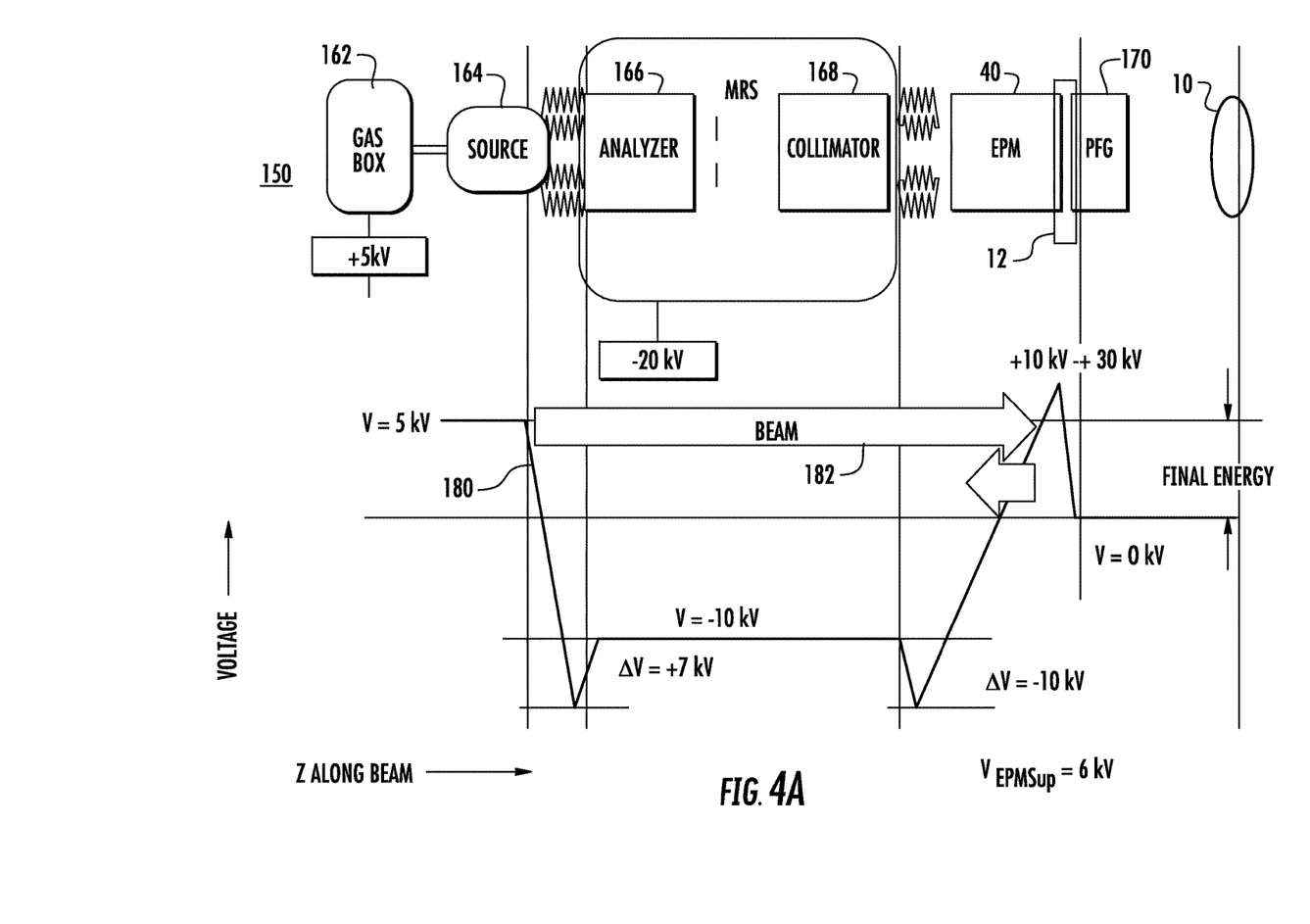
FIG. 4A shows one scenario for operation of a beamline ion implantation system consistent with the present embodiments.

Turning now to FIG. 4A, there is shown one scenario for operation of a beamline ion implantation system consistent with the present embodiments, shown as ion implantation system 150. Also shown in FIG. 4A, is an ion beam 182 and exemplary voltage curve 180 representing the potential at various portions of the beamline of the ion implantation system 150. As shown, the ion implantation system 150 may include known components including a gas box 162, an ion source 164, an analyzer 166, mass resolving slit (MRS), collimator 168, electrostatic filter 40, plasma flood source 170, and substrate 10. For purposes of illustration the components are shown arranged in a linear fashion, while a more accurate representation of relative positioning of components is shown in FIG. 2, for example. In the embodiment of FIG. 4A the ion source 164 is biased at a +5 kV potential while beamline components in the intermediate region of the beamline, such as the analyzer 166 and collimator 168, are biased at −10 kV. At least some of the electrostatic elements of the electrostatic filter 40 are also biased negatively, while a positive voltage is applied to the stopping element 12. In this example, a stopping voltage applied to the stopping element 12 may range from +10 kV to +30 kV. The embodiments are not limited in this context. Finally, the substrate 10 is at 0V potential in this example.

Figure 4B:
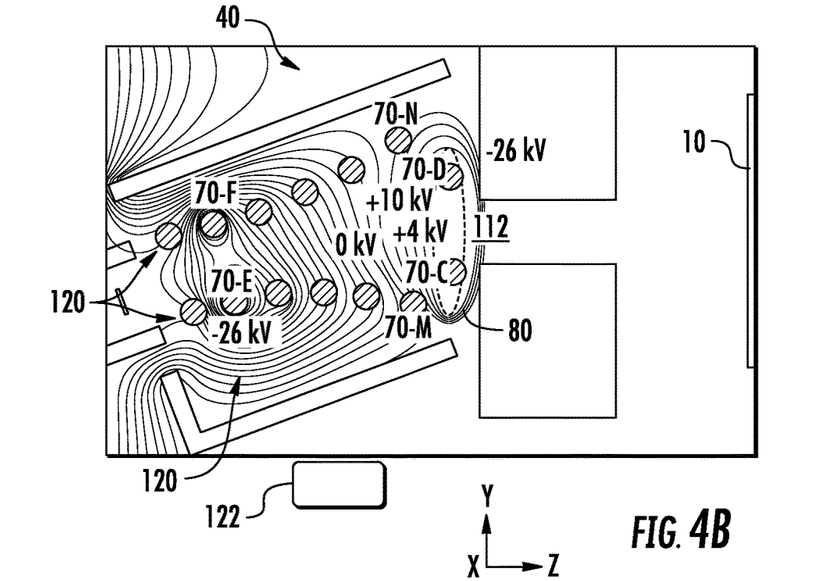
FIG. 4B shows the results of simulation of operation of a stopping element under the general scenario of FIG. 4A, when +10 kV is applied.
Figure 4C:
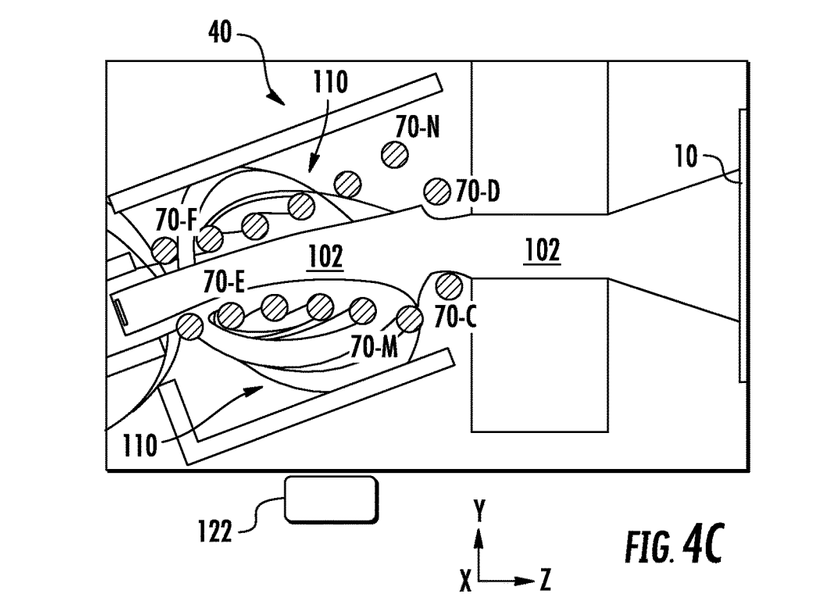
FIG. 4C there is shown the result of simulation of a 5 kV argon ion beam, as generated in the scenario of FIG. 4A.

Turning now to FIG. 4B and FIG. 4C, there is shown the results of simulation of operation of the stopping element 12 under the general scenario of FIG. 4A. In the particular example of FIG. 4B a stopping element is embodied in the electrostatic filter 40 and a stopping voltage of +10 kV is applied. As shown, the electrostatic element 70-C and electrostatic element 70-D act as a stopping element, labeled as stopping element 80 in this variant, while performing as generally described above. In this embodiment, and in various other embodiments, save for stopping element 80, the voltages applied to electrodes of the electrostatic filter 40 may be similar to those voltages used in a beam processing mode to allow propagation of an ion beam through the electrostatic filter 40. For example, a voltage supply assembly 122, including a plurality of separate voltage sources (not separately shown), may supply voltage individually to the electrodes of the electrostatic filter 40 aside from stopping element 80. The voltages may be negative voltages and may vary between different electrodes as in known electrostatic filters. The voltages applied by the voltage supply assembly 122 may in particular be negative with respect to the stopping voltage. The +10 kV voltage applied to the stopping element 80 as well as voltages applied to the other electrodes generate electric fields represented by a series of equipotential curves 120. These equipotential curves are thus related to the different voltages applied to the various electrodes of the electrostatic filter 40. For example, a potential of approximately −26 kV surrounds the region near electrostatic element 70-E, indicative of the voltage applied to the electrostatic element 70-E. The potential becomes increasingly positive toward the right. The +10 kV voltage applied to the stopping element 80 has the effect of generating positive potentials of several thousand volts that extend in the region 112 between the electrostatic element 70C and electrostatic element 70-D.

Turning now to FIG. 4C there is shown the result of simulation of a 5 kV argon ion beam, such as may be generated in the scenario of FIG. 4A, propagating through the electrostatic filter 40 under the conditions of the electrostatic filter 40 shown in FIG. 4B. As shown, an argon ion beam 102 propagates into the electrostatic filter 40. The electric fields generated by the stopping element 80 are sufficient to stop a portion of the ion beam 102 and to direct ions 110 backwardly toward the other electrodes of electrostatic filter 40. The ions 110, in turn, may become attracted to the other electrostatic elements of the electrostatic filter 40, as shown. Notably, the trajectory of the ions 110 may be curved according to the shape of the electric fields generated by the assemblage of different potentials applied to the different electrodes within the electrostatic filter. The deflection of ions backwardly and generally in an upstream direction from a downstream position have the effect of cleaning shadowed surface regions of the electrostatic elements that are not exposed to the ion beam 102 as the ion beam 102 propagates toward the substrate 10. As shown in FIG. 4C, a portion of the ion beam 102 may also propagate to the substrate 10 in this scenario.

In various additional embodiments where an electrostatic filter may include, for example, an entrance electrode and an exit electrode disposed downstream of the entrance electrode, the stopping element may be disposed intermediate the entrance electrode and exit electrode. For example, while in FIG. 4B the stopping element is embodied in a last pair of electrostatic elements before the exit of the electrostatic filter 40, in other embodiments other electrodes within the electrostatic filter 40 may be employed as a stopping element.

Figure 4D:
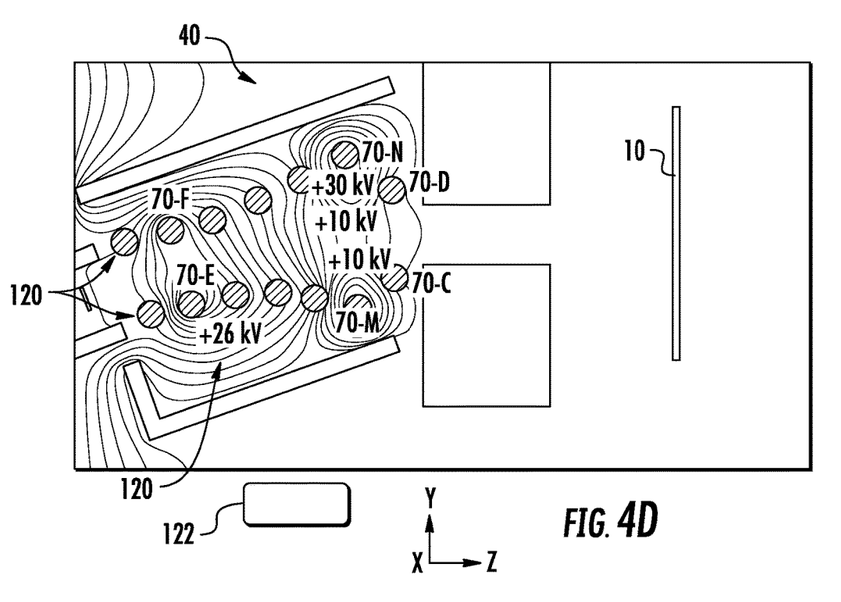
FIG. 4D depicts a simulation based on the general scenario of FIG. 4A, where a +40 kV voltage is applied to a stopping element different from the stopping element of FIG. 4B.
Figure 4E:
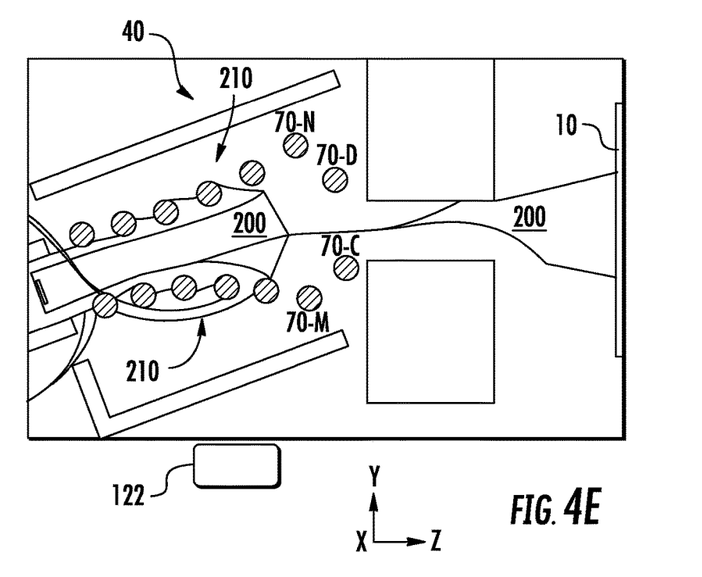
FIG. 4E depicts the result of simulation of a 5 kV argon ion beam, such as may be generated in the scenario of FIG. 4A.

In the simulation shown in FIG. 4D, the general scenario of FIG. 4A remains the same, while a +30 kV voltage is applied to a stopping element 90, in this case formed from the electrostatic element 70-N and electrostatic element 70-M. As shown in FIG. 4E, this higher voltage generates electric fields of approximately 10 kV in a region close to where an ion beam may propagate between the electrostatic element 70-N and electrostatic element 70-M.

Turning now to FIG. 4E there is shown the result of simulation of a 5 kV argon ion beam, such as may be generated in the scenario of FIG. 4A, propagating through the electrostatic filter 40 under the conditions of the electrostatic filter 40 shown in FIG. 4D. As shown, an ion beam, in this case an argon ion beam 200, propagates into the electrostatic filter 40. The electric fields generated by the stopping element 90 are sufficient to stop a portion of the argon ion beam 200 and to direct ions 210 backwardly toward the other electrodes of electrostatic filter 40. The ions 210, in turn, may become attracted to the other electrostatic elements of the electrostatic filter 40, as shown. This may have the effect of cleaning shadowed portions of the electrostatic elements. As shown, a smaller portion of the argon ion beam 200 may propagate to the substrate 10 in this scenario. As suggested by the results of FIG. 4C and FIG. 4E, if a sufficiently high positive voltage is applied to a stopping element, sufficiently high electric potentials may be generated in a central region between stopping electrodes so an entirety of the ion beam may be stopped.

In additional embodiments where an electrostatic filter is configured with an entrance electrode and an exit electrode disposed downstream of the entrance electrode, the stopping element may be disposed at any position intermediate the entrance electrode and exit electrode.

Figure 5A:
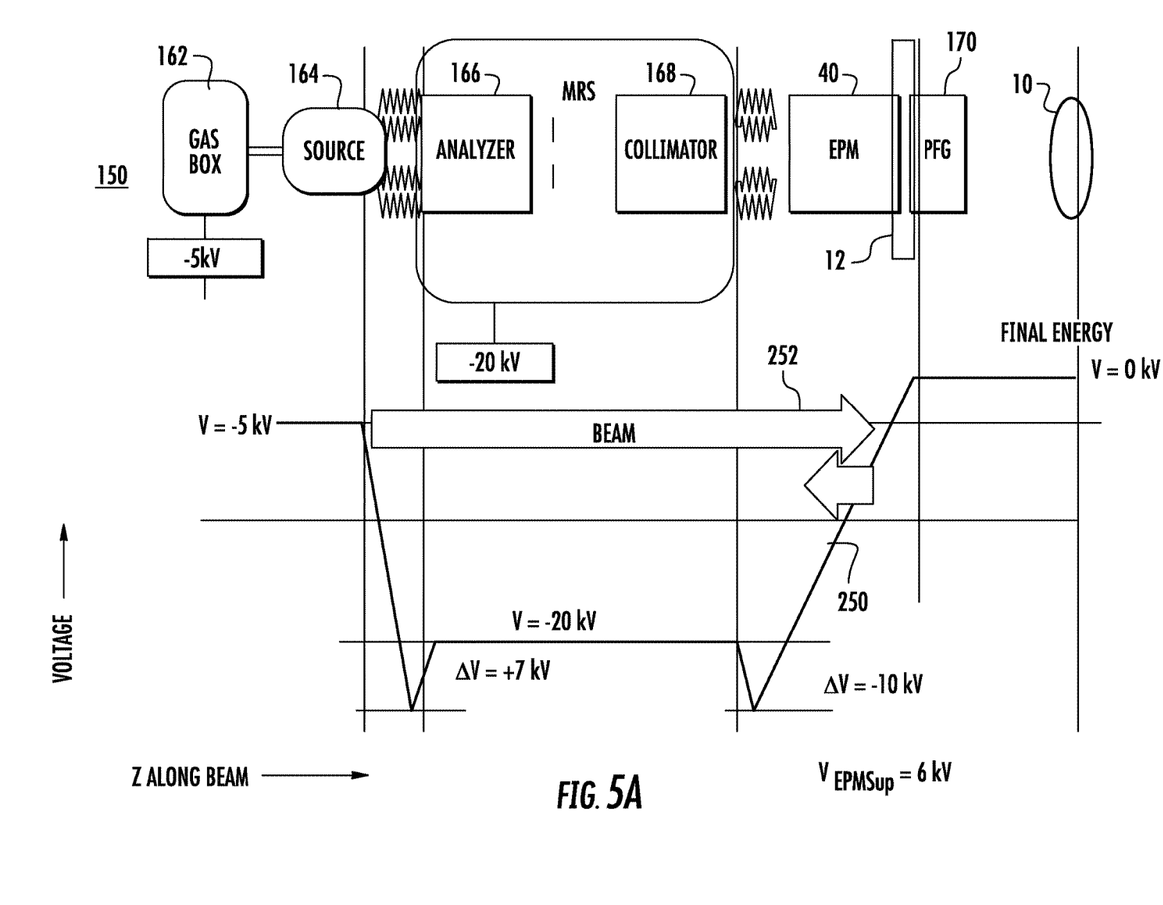
FIG. 5A shows in block form a beamline ion implantation system.

In further embodiments of the disclosure, a beamline ion implantation system may be configured where voltages applied to various beamline components are different than in conventional beamline ion implantation systems. Turning now to FIG. 5A, there is shown in block form a beamline ion implantation system, shown as ion implantation system 150. Also shown in FIG. 5A, is an exemplary voltage curve 250 representing the potential at various portions of the beamline of the ion implantation system 150. In this example, instead of biasing the ion source at a positive potential as in known beam line ion implantation procedures, a −5 kV potential is applied to the ion source 164, while beamline components in the intermediate region of the beamline, such as the analyzer 166 and collimator 168, are biased at −20 kV. At least some of the electrostatic elements of the electrostatic filter 40 are also biased negatively, while a stopping voltage of 0V is applied to the stopping element 12. Notably, because the ion source 164 is biased more negatively than the substrate 10 (as well as stopping element 12) an ion beam 252 may be completely stopped when traversing near the stopping element 12. This may impart the advantage of preventing any unwanted ions from entering a substrate area during a cleaning process.

Figure 5B:
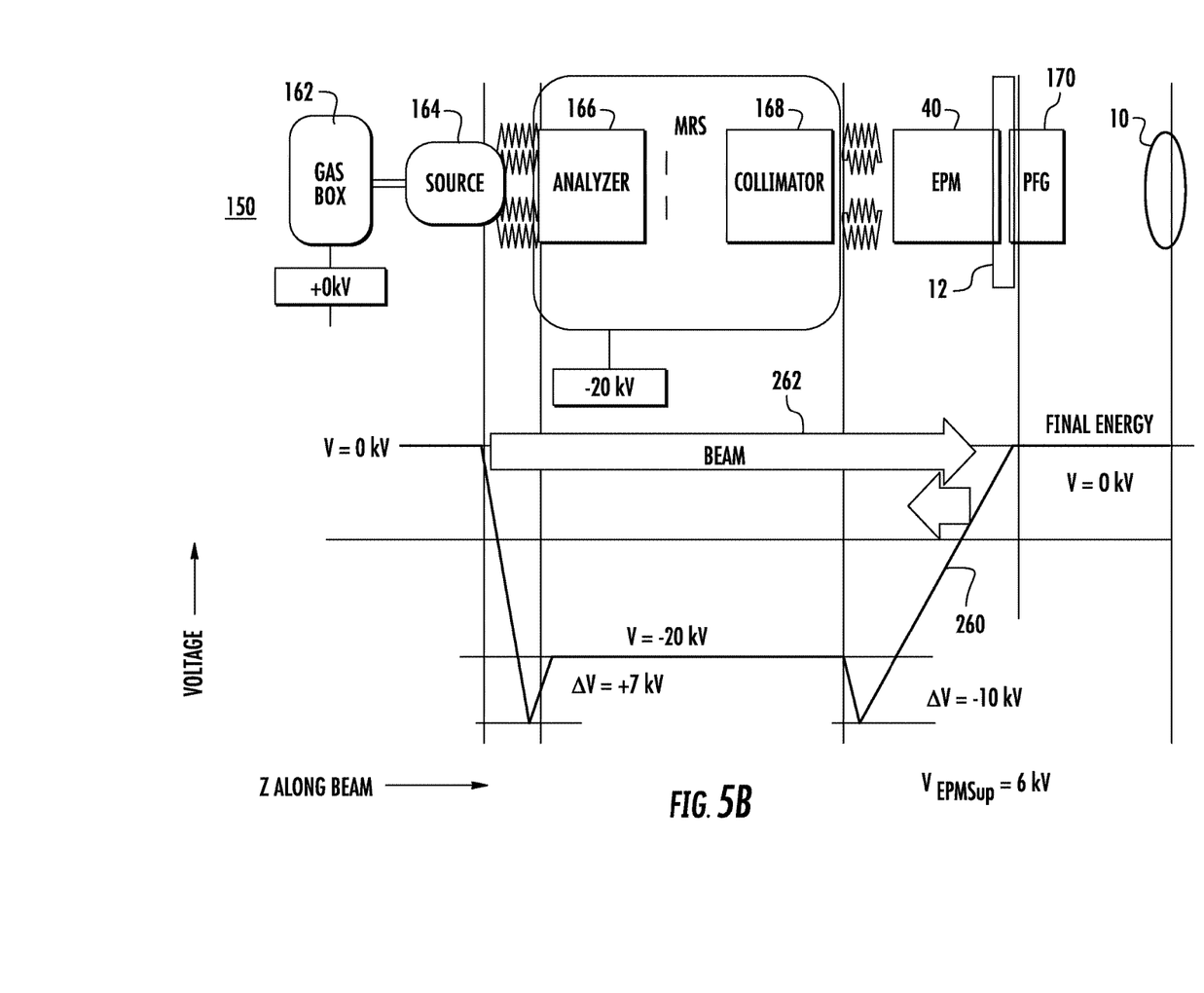
FIG. 5B shows another exemplary voltage curve representing the potential at various portions of the beamline of the ion implantation system of FIG. 5A.

Turning now to FIG. 5B, there is shown another exemplary voltage curve 260 representing the potential at various portions of the beamline of the ion implantation system 150. In this example, instead of biasing the ion source at a positive potential as in known beam line ion implantation procedures, a 0 kV (ground) potential is applied to the ion source 164, while beamline components in the intermediate region of the beamline, such as the analyzer 166 and collimator 168, are biased at −20 kV. At least some of the electrostatic elements of the electrostatic filter 40 are also biased negatively, while a stopping voltage of 0V is applied to the stopping element 12. Notably, because the ion source 164 is biased at the same potential as the substrate 10, an ion beam 262 may also be completely stopped when traversing near the stopping element 12. This may impart the advantage of preventing any unwanted ions from entering a substrate area during a cleaning process, while not needing to apply a voltage to the ion source 164.

Figure 6:
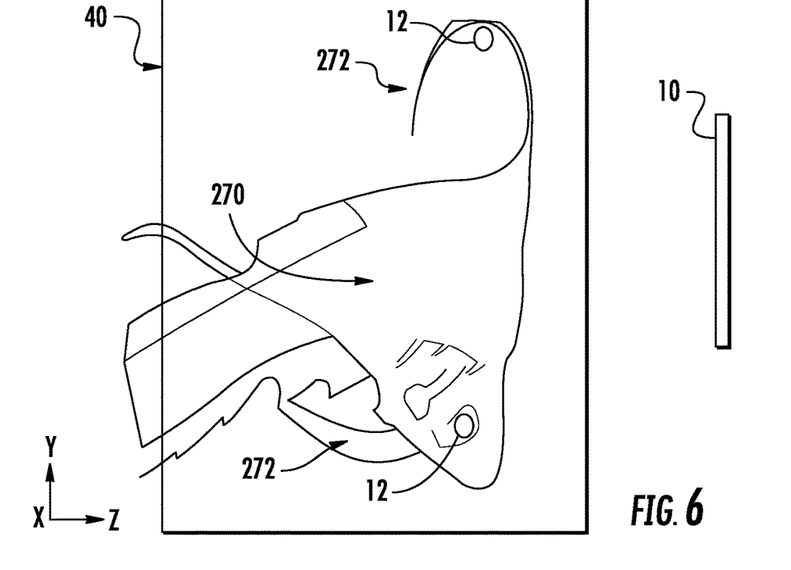
FIG. 6. Shows a simulation of an ion beam processed under the conditions of FIG. 5A.

A simulation of an ion beam 270 processed under the conditions of FIG. 5A is shown in FIG. 6. As illustrated, the ion beam 270 propagates toward the right in the figure and is stopped at the position of stopping element 12 (0V), generating the ions 272 where the ions 272 are directed backwardly as shown. Little or no propagation of the ion beam 270 to the substrate 10 occurs.

According to additional embodiments, a stopping element may be a substrate holder. In this manner, the substrate holder or a substrate located on the substrate holder may stop and approaching ion beam and deflect the ion beam backwardly. The deflected ions created from an ion beam traversing near the substrate holder may accordingly impinge upon at least one component located between the ion source and the substrate holder. This may facilitate cleaning in regions located upstream of the substrate, where such regions are not usually impacted by ion beams during processing mode.

Figure 7:
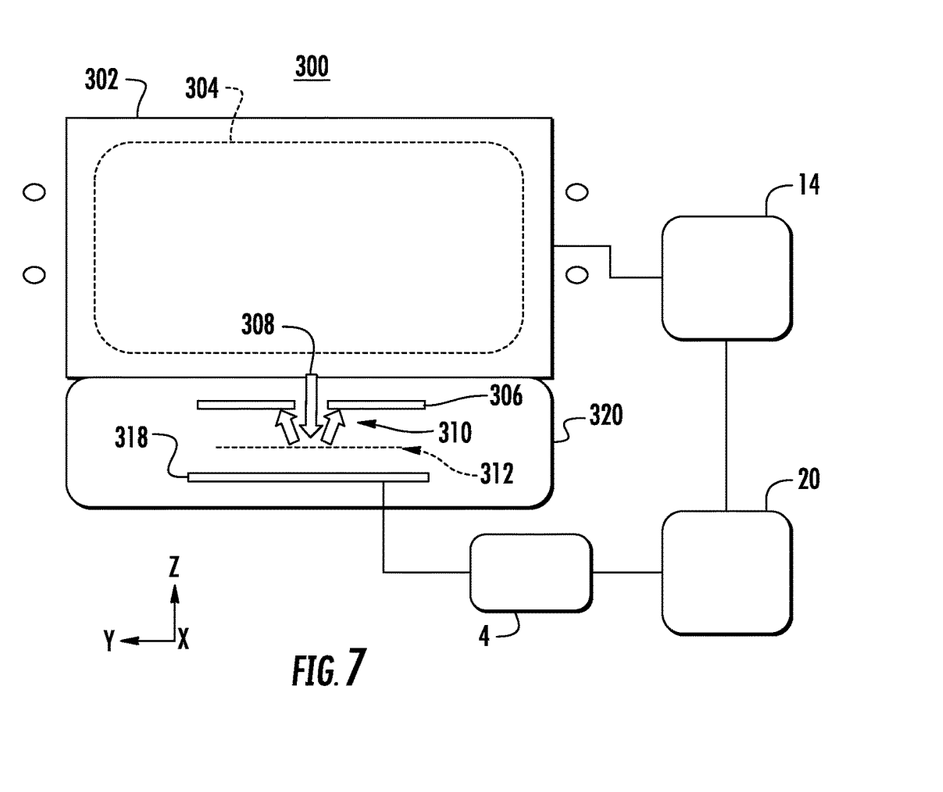
FIG. 7 depicts an embodiment of an ion beam system employing a plasma chamber to generate a plasma.

In other embodiments, a stopping element may be deployed in a compact ion beam system. FIG. 7 depicts an embodiment of an ion beam system 300 where the ion beam system 300 employs a plasma chamber 302 to generate a plasma 304. The plasma chamber 302 may be any of known designs and the plasma 304 may be generated according to any of known plasma apparatus. As shown in FIG. 7, an extraction assembly 306 is provided adjacent the plasma chamber 302, and may be biased negatively with respect to the plasma chamber to extract an ion beam 308. In one implementation, the plasma chamber 302 may be grounded (0V applied by voltage supply 14) during operation to process a substrate. In addition, a stopping element 318 may be positioned in a process chamber 320. Under processing mode of operation, a substrate holder (not separately shown) may be biased negatively to attract positive ions from the plasma 304. Under a cleaning mode of operation, the stopping element 318, in some embodiments the same as a substrate holder, may be biased positively with respect to the plasma chamber 302. This biasing may halt the ion beam 308, and may generate the reflected ions 310, directed backwardly from a zero voltage plane 312 toward the extraction assembly 306. In this mode the extraction assembly 306 and other parts not generally exposed to the ion beam 308 may be cleaned by sputter etching, reactive etching, or other etching caused by the reflected ions 310.

In additional embodiments, a stopping voltage may be applied to electrodes of an electrostatic filter in different ways. For example, in electrostatic filters where a stopping element is configured as an electrode composed of a pair of rods, the electrostatic filter may include a second a second electrode including a second pair of rods and a third electrode including a third pair of rods. In this configuration, according to one embodiment, in addition to a stopping voltage applied to a stopping electrode, a second voltage may be applied to the second electrode; and a third voltage may be applied to the third electrode, different than the second voltage. The second voltage and third voltage may be less positive than the stopping voltage, and may have a negative potential, attracting the deflected ions. Because of the different voltages, a first flux of the deflected ions intercepted by the second electrode may be different than a second flux of the deflected ions intercepted by the third electrode. In this manner, the amount of ions directed to different electrodes within an electrostatic filter may be tailored according to a target amount of cleaning for a given electrode, by adjusting the voltages on the second electrodes, third electrodes, and other electrodes in the electrostatic filter.

In additional embodiments reactive gas may be flowed through a plasma flood source, such as plasma flood source 170, where the plasma flood source is disposed between the stopping electrode and the substrate position. In this manner reactive species from the plasma flood source may impinge upon at least one additional electrode not used as the stopping element for cleaning. This may aid in removal of material from the electrodes in addition to etching caused by ions redirected backwardly toward shadowed surface regions. A balance between sputter cleaning and reactive ion etching may be tuned depending on the amount of reactive gas flowed through the plasma flood source.

Referring again to FIG. 2, in still further embodiments, a second ion beam may be generated using a plasma source, such as plasma flood source 42, disposed downstream of the stopping element. In this manner, the second ion beam and additionally a deflected ion beam caused by the stopping element may be directed upon electrodes or other surfaces to be cleaned.

In still further embodiments, a cleaning ion beam may be manipulated not just by electrostatic elements, but also by either already present magnets or additional magnets to direct an beam to the non-line of sight (or other) regions of a beamline.

In other additional embodiments, the apparatus and techniques generally disclosed hereinabove may be employed with negative ions to perform in-situ cleaning. In these additional embodiments, an ion source may generate an ion beam comprising negative ions, where a first voltage is applied to the ion source. The stopping voltage supply may be directed to apply a stopping voltage to the stopping element where the stopping voltage is equal to or more negative than the first voltage.

Figure 8:
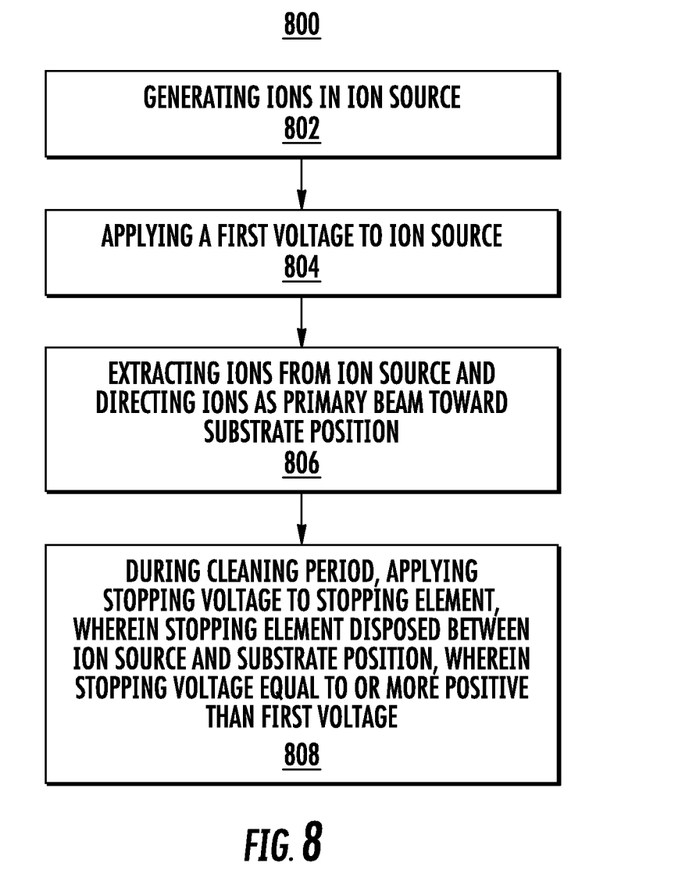
FIG. 8 shows an exemplary process flow according to embodiments of the disclosure.

Turning now to FIG. 8 there is shown an exemplary process flow 800 according to embodiments of the disclosure. At block 802, ions are generated in an ion source. The ion source may be, for example, an ion source in a beamline ion implanter, or a plasma chamber in a compact ion beam apparatus. The embodiments are not limited in this context. At block 804 a first voltage is applied to the ion source. At block 806, ions are extracted from the ion source and directed as a primary ion beam toward a substrate position within the given ion beam apparatus. At block 808, during a cleaning period a stopping voltage is applied to a stopping element disposed between the ion source and substrate position, where the stopping element is equal to or more positive than the first voltage. In various embodiments the stopping element may be a component of a beam line, such as an electrode in an electrostatic filter, a substrate holder, or substrate. The embodiments are not limited in this context. In this manner, at least a portion of the primary ion beam may be deflected backwardly from an initial trajectory as deflected ions.

In view of the foregoing, at least the following advantages are achieved by the embodiments disclosed herein. Firstly, providing a stopping element facilitates in-situ cleaning of surfaces within an ion beam apparatus tending to accumulate material during processing. Secondly, some embodiments may harness existing electrodes or components within an ion beam apparatus to perform in-situ cleaning without need for extensive redesign or addition of components inside of an apparatus, such as a beam-line ion implantation system. Thirdly, various embodiments provide the ability of a stopping element to prevent a cleaning ion beam from impacting a substrate position during a cleaning mode, preserving a substrate holder or substrate from unwanted ion exposure during cleaning.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth of the present disclosure as described herein.

The invention claimed is:

1. An apparatus, comprising:
an ion source generating an ion beam, the ion source coupled to a first voltage;
a stopping element disposed between the ion source and a substrate position;
a stopping voltage supply coupled to the stopping element; and
a control component to direct the stopping voltage supply to apply a stopping voltage to the stopping element, the stopping voltage being equal to or more positive than the first voltage when the ion beam comprises positive ions, and being equal to or more negative than the first voltage when the ion beam comprises negative ions, wherein at least a portion of the ion beam is deflected backwardly from an initial trajectory as deflected ions when the stopping voltage is applied to the stopping element.

2. The apparatus of claim 1, wherein the stopping element comprises an electrode configured as a first pair of rods, the electrode being disposed in an electrostatic filter, the electrostatic filter further comprising at least one additional electrode comprising a second pair of rods and disposed upstream of the stopping element, wherein the at least one additional electrode includes a shadowed surface region not exposed to the ion beam, wherein the shadowed surface region intercepts the deflected ions.

3. The apparatus of claim 2, wherein the electrostatic filter comprises an entrance electrode and an exit electrode disposed downstream of the entrance electrode, and wherein the stopping element is disposed intermediate the entrance electrode and exit electrode.

4. The apparatus of claim 2, further comprising a magnet to direct at least a portion of the ion beam to the shadowed surface region.

5. The apparatus of claim 1, wherein the ion beam comprises positive ions and is not deflected backwardly when a third voltage is applied to the stopping element, the third voltage being less positive than the stopping voltage.

6. A system, comprising:
an ion source generating an ion beam, the ion source coupled to a first voltage;
a substrate stage disposed downstream of the ion source, the substrate stage to house a substrate;
at least one beamline component to direct the ion beam as a primary ion beam toward the substrate stage;
a stopping element disposed downstream of the ion source;
a stopping voltage supply coupled to the stopping element; and
a control component to direct the stopping voltage supply to apply a stopping voltage to the stopping element, the stopping voltage being equal to or more positive than the first voltage when the ion beam comprises positive ions, and being equal to or more negative than the first voltage when the ion beam comprises negative ions,
wherein at least a portion of the primary ion beam is deflected backwardly as deflected ions away from the substrate when the stopping voltage is applied to the stopping element.

7. The system of claim 6, wherein the stopping element comprises an electrode configured as a first pair of rods, the electrode being disposed in an electrostatic filter, the electrostatic filter further comprising at least one additional electrode comprising a second pair of rods and disposed upstream of the stopping element, wherein the at least one additional electrode includes a shadowed surface region not exposed to the primary ion beam, wherein the shadowed surface region intercepts the deflected ions.

8. The system of claim 7, wherein the electrostatic filter comprises an entrance electrode and an exit electrode disposed downstream of the entrance electrode, and wherein the stopping element is disposed intermediate the entrance electrode and exit electrode.

9. The system of claim 7, further comprising:
a gas source disposed between the stopping element and the substrate stage, wherein reactive species are directed to the shadowed surface region from the gas source.

10. The system of claim 7, further comprising:
a plasma source disposed between the stopping element and the substrate stage; wherein the control component includes logic to send a signal to generate a plasma in the plasma source when the stopping voltage is applied to the stopping element, and wherein a second ion beam is extracted from the plasma source and directed to the electrostatic filter.

11. The system of claim 6, wherein the stopping element comprises a substrate holder disposed on the substrate stage to hold the substrate.

12. The system of claim 6, wherein the ion beam comprises reactive ions.

13. A method, comprising:
generating ions in an ion source;
applying a first voltage to the ion source;
extracting the ions from the ion source and directing the ions as a primary ion beam toward a substrate position; and
during a cleaning period applying a stopping voltage to a stopping element, the stopping element being disposed between the ion source and substrate position,
wherein the stopping voltage is equal to or more positive than the first voltage when the primary ion beam comprises positive ions, and being equal to or more negative than the first voltage when the primary ion beam comprises negative ions,
and wherein at least a portion of the primary ion beam is deflected backwardly from an initial trajectory as deflected ions.

14. The method of claim 13, wherein the stopping element comprises an electrode configured as a first pair of rods is disposed in an electrostatic filter, the electrostatic filter further comprising at least one additional electrode comprising a second pair of rods and disposed upstream of the stopping element, wherein the at least one additional electrode includes a shadowed surface region not exposed to the primary ion beam, wherein the shadowed surface region intercepts the deflected ions.

15. The method of claim 14, wherein the at least one additional electrode comprises a second electrode including the second pair of rods and a third electrode including a third pair of rods, the method further comprising;
applying a second voltage to the second electrode; and
applying a third voltage to the third electrode, different than the second voltage, the second voltage and third voltage being less positive than the stopping voltage,
wherein a first flux of the deflected ions intercepted by the second electrode is different than a second flux of the deflected ions intercepted by the third electrode.

16. The method of claim 14, further comprising flowing reactive gas through a plasma flood source disposed between the stopping element and the substrate position, wherein reactive species from the plasma flood source impinge upon the at least one additional electrode.

17. The method of claim 14, wherein the electrostatic filter comprises an entrance electrode and an exit electrode disposed downstream of the entrance electrode, and wherein the stopping element is disposed intermediate the entrance electrode and exit electrode.

18. The method of claim 14, further comprising generating a second ion beam using a plasma flood source disposed downstream of the stopping element, wherein ions from the second ion beam impinge upon the at least one additional electrode.

19. The method of claim 13, wherein the stopping element comprises a substrate holder, wherein the deflected ions impinge upon at least one component between the ion source and the substrate holder.

20. The method of claim 13, wherein the deflected ions comprise reactive ions.

* * * * *